US012615056B2

(12) United States Patent
Moeneclaey et al.

(10) Patent No.: US 12,615,056 B2
(45) Date of Patent: Apr. 28, 2026

(54) AMBIENT LIGHT SENSOR

(71) Applicants: STMicroelectronics (Grenoble 2) SAS, Grenoble (FR); STMicroelectronics (Alps) SAS, Grenoble (FR)

(72) Inventors: Nicolas Moeneclaey, Vourey (FR); Laurent Vaccariello, Fontanil-Cornillon (FR)

(73) Assignees: STMicroelectronics (Grenoble 2) SAS, Grenoble (FR); STMicroelectronics (Alps) SAS, Grenoble (FR)

( * ) Notice: Subject to any disclaimer, the term of this patent is extended or adjusted under 35 U.S.C. 154(b) by 627 days.

(21) Appl. No.: 18/112,056

(22) Filed: Feb. 21, 2023

(65) Prior Publication Data

US 2023/0268928 A1 Aug. 24, 2023

(30) Foreign Application Priority Data

Feb. 22, 2022 (FR) ...................................... 2201567

(51) Int. Cl.
  *H03M 1/38* (2006.01)
  *G01J 1/44* (2006.01)
  *H10F 39/10* (2025.01)
(52) U.S. Cl.
  CPC ................. *H03M 1/38* (2013.01); *G01J 1/44* (2013.01); *H10F 39/103* (2025.01);
    (Continued)
(58) Field of Classification Search
  CPC .... H10F 39/803; H10F 39/807; H10F 39/103; H10F 39/107; G01J 1/4204; G01J 1/44;
    (Continued)

(56) References Cited

U.S. PATENT DOCUMENTS

2014/0367552 A1    12/2014   Hynecek et al.
2017/0350756 A1*   12/2017   Panicacci ............... H04N 25/78

FOREIGN PATENT DOCUMENTS

CN      207083171 U      3/2018
CN      207099209 U      3/2018
CN      220230724 U      12/2023

OTHER PUBLICATIONS

Tsung-Yu, Tsai et al.: "Current-mode ambient light sensor for ultralow-power applications", Jpn. J. Appl. Phys, [Online] vol. 53, Jan. 1, 2014 (Jan. 1, 2014), pp. 4-21, XP055952626.
(Continued)

*Primary Examiner* — Lin Ye
*Assistant Examiner* — Steven Daniel Barry
(74) *Attorney, Agent, or Firm* — Crowe & Dunlevy LLC

(57) ABSTRACT

An ambient light sensor includes pixels arranged in an array. Each pixel includes a doped insulated well of a first type, a pinned photodiode in the well, a doped region of a second type arranged in the well, a transfer gate coupling the photodiode to said region, and a first circuit applying a first or second potential to the well. A successive approximation analog-to-digital converter of the sensor has a node connected to the doped regions of the pixels, a switch applying a third potential to the node, a comparator coupled to the node, and a second circuit receiving an output of the comparator and controlling the first circuits to selectively apply the first and second potentials. A sensor control circuit controls the gates and the first switch.

18 Claims, 4 Drawing Sheets

(52) U.S. Cl.
CPC ...... H10F 39/107 (2025.01); *G01J 2001/446*
(2013.01); *G01J 2001/448* (2013.01)

(58) Field of Classification Search
CPC ......... G01J 2001/446; G01J 2001/448; H03M
1/38; H04N 25/772; H04N 25/78
See application file for complete search history.

(56) References Cited

OTHER PUBLICATIONS

Scott M.D. et al: "An ultralow-energy adc for smart dust", IEEE
Journal of Solid-State Circuits, [Online] vol. 38, No. 7, Jul. 1, 2003
(Jul. 1, 2003), pp. 1123-1129, XP055952630.
Yun Kean Woon et al: "Optional CMOS based Monolithic Light
Sensor for Detection of Light Intensity", International Journal of
Integrated Engineering Vol, [Online] vol. 13, Jan. 1, 2021 (Jan. 1,
2021), pp. 72-81, XP055952634.
INPI Search Report and Written Opinion for priority application, FR
2201567, report dated Oct. 18, 2022, 9 pgs.
CN First Office Action and Search Report for counterpart CN Appl.
No. 202310148306.0, report dated Jan. 29, 2026, 9 pgs.

* cited by examiner

AMBIENT LIGHT SENSOR

PRIORITY CLAIM

This application claims the priority benefit of French Application for Patent No. 2201567, filed on Feb. 22, 2022, the content of which is hereby incorporated by reference in its entirety to the maximum extent allowable by law.

TECHNICAL FIELD

The present disclosure generally concerns electronic circuits or devices and, in particular, ambient light sensors.

BACKGROUND

Known ambient light sensors comprise a plurality of pixels, each pixel comprising a photoconversion element such as a photodiode. In such a sensor, during the integration phase of an ambient light sensor, charges are photogenerated in the photoconversion elements of the sensor and accumulate therein. During the readout phase of the ambient light sensor, an analog signal (AC) representative of the quantity of photogenerated charges accumulated in the photoconversion elements is obtained. This signal is then converted into a corresponding digital signal, for example so that this digital signal can be processed by a digital processing circuit.

There is a need to overcome all or part of the disadvantages of known ambient light sensors.

For example, there is a need to overcome all or part of the disadvantages of known light sensors which are linked to the previously-described analog-to-digital conversion step.

SUMMARY

An embodiment overcomes all or part of the disadvantages of known ambient light sensors, for example, all or part of the disadvantages which are linked to the above-described analog-to-digital conversion step.

An embodiment provides an ambient light sensor comprising a plurality of pixels. Each pixel of the plurality of pixels comprises: a first doped insulated well of a first conductivity type, a pinned photodiode arranged in the first doped insulated well, a first doped region of a second conductivity type arranged in the first doped insulated well, a first transfer gate coupling the photodiode to the first region, and a first circuit configured to selectively apply a first potential and a second potential to the first doped insulated well. The sensor further comprises a successive approximation analog-to-digital converter comprising a first node connected to the first regions of all the pixels of the plurality of pixels, a first switch configured to selectively apply a third potential to the first node, a comparator having a first input coupled to the first node, and a second circuit configured to receive an output of the comparator and to control the first circuits of the pixels. Further, the sensor comprises a control circuit configured to control the first transfer gates and the first switch.

According to an embodiment, a second input of the comparator is coupled to a comparison potential.

According to an embodiment, the comparison potential is determined, at least partly, by the third potential.

According to an embodiment, each pixel of the plurality of pixels further comprises a second doped insulated well of the first conductivity type configured to receive the first potential, a second doped region of the second conductivity type arranged in the second doped insulated well, and a second transfer gate coupled to the second semiconductor region. The converter further comprises a second node connected to the second regions of all the pixels of the plurality of pixels, and a second switch configured to selectively apply the third potential to the second node. The second node is coupled to the second input of the comparator.

According to an embodiment, the converter further comprises a first analog buffer having an input connected to the first node and an output coupled to the first input of the comparator, and a second analog buffer having an input connected to the second node and an output coupled to the second input of the comparator. The first and second analog buffers are preferably identical.

According to an embodiment, the control circuit is further configured to control the second switch identically to the first switch.

According to an embodiment, the control circuit is further configured to: control the second transfer gates; and maintain the second transfer gates in the non-conductive state all along the duration of each phase of ambient light capture by the sensor.

According to an embodiment, during each phase of analog-to-digital conversion of a potential of the first node, the second circuit is configured to control the first circuits of the pixels based on the output of the comparator.

According to an embodiment, during each phase of analog-to-digital conversion of a potential of the first node, the control circuit is configured to maintain the first switch off.

According to an embodiment: the pixels of the plurality of pixels are distributed into a plurality of groups of pixels; each pixel of the plurality of pixels belongs to a single group among said plurality of groups of pixels; and the second circuit is configured, during each phase of analog-to-digital conversion of a potential of the first node and for each group of pixels, to identically control the first circuits of the pixels of said group.

According to an embodiment, the second circuit is configured, at each of the successive approximations of the converter, to switch the potential applied to the first doped insulated wells of the pixels of at least one group by the corresponding first circuits.

According to an embodiment, during each phase of initialization of the photodiodes, the control circuit is configured to switch to the conductive state the first transfer gates of all the pixels of the plurality of pixels and to control a turning-on of the first switch.

According to an embodiment, during each integration phase, the control circuit is configured to maintain in the non-conductive state the first transfer gates of all the pixels of the plurality of pixels all along the duration of the integration phase and, preferably, to maintain the first switch in the on state.

According to an embodiment, during each readout phase: the control circuit is configured to switch to the conductive state the first transfer gates of at least certain pixels of the plurality of pixels, a number of said at least certain pixels determining, for example, a gain of the sensor; and the control circuit is configured to maintain the first switch off all along the duration of the readout phase.

According to an embodiment, all along the duration of each phase of initialization of the photodiodes, each integration phase, and each readout phase, the second circuit is configured so that the first circuits apply the first potential to the first doped insulated wells of all the pixels of the plurality of pixels.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Figure 1:
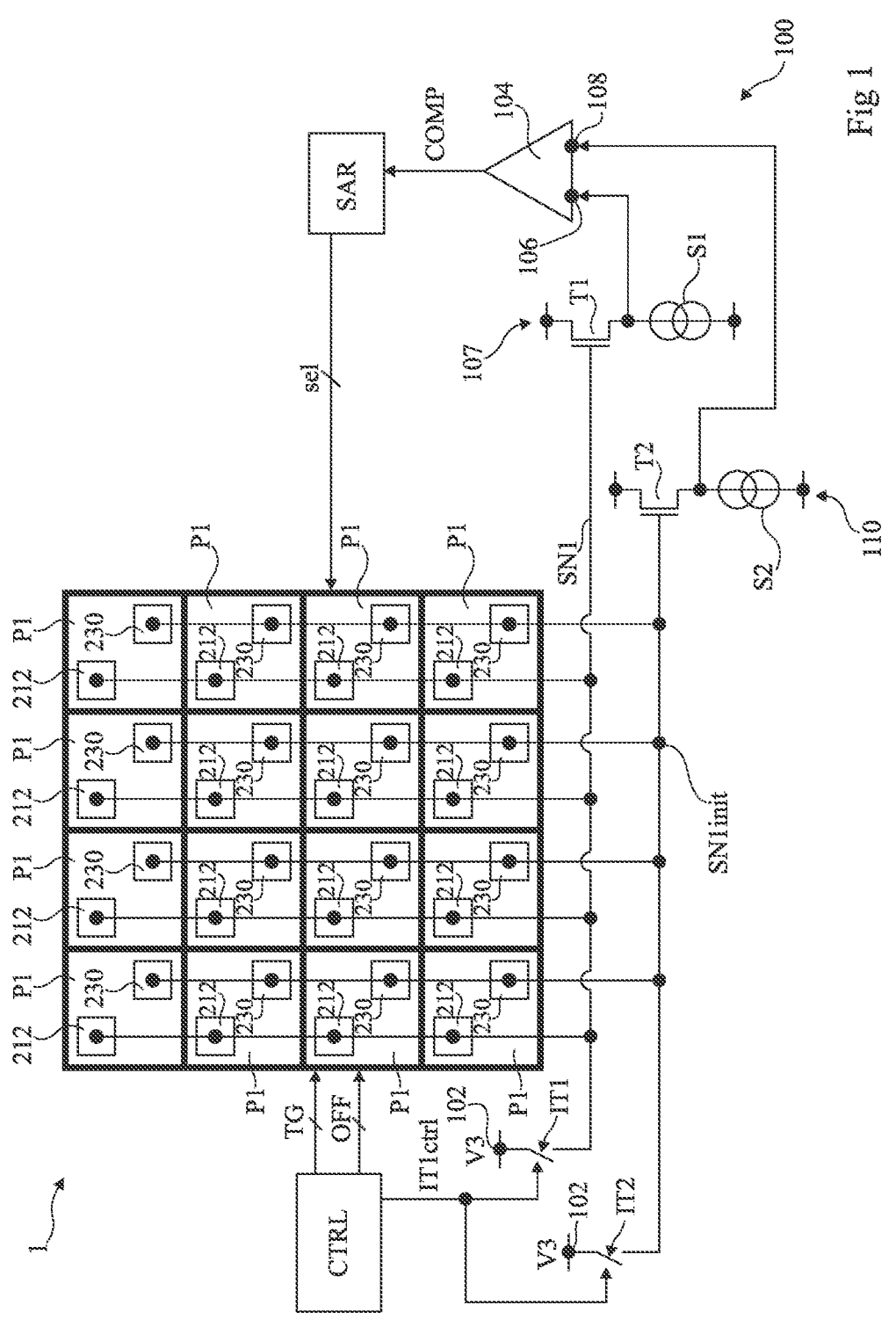
FIG. 1 schematically shows an embodiment of an ambient light sensor.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

An ambient light sensor comprising pixels each having a transfer gate between a photodiode of the pixel and a readout region is here considered. In this sensor, the readout regions of a plurality of pixels of the sensor are coupled to a same sense node.

Embodiments provide using the capacitances of the readout regions of these pixels to implement a bank of capacitive elements of a successive approximation analog-to-digital converter connected to the sense node.

In particular, embodiments provide for each pixel having its readout region connected to the sense node to be configured so that a first potential or a second potential can be selectively applied to a semiconductor well of the pixel having the photodiode and the readout region of the pixel arranged therein. Thus, the potential applied to the well of each of these pixels may be modified, to implement the successive approximations of the analog-to-digital converter.

Such a sensor requires no transimpedance amplifier (TIA) to read the pixels.

Further, such a sensor is less bulky than a similar sensor comprising a successive approximation analog-to-digital converter where the capacitive elements of the converter would be implemented by means of capacitors, each comprising two opposite conductive electrodes and separated from each other by an insulating layer.

According to an embodiment, the sensor is implemented in a screen of an electronic device, for example, under an organic light-emitting diode (OLED) screen. Preferably, the screen is controlled by alternating phases of light emission and phases where no light is emitted, with a frequency such that phases where no light is emitted are not perceptible by the human eye. Preferably, each step of integration of the ambient light by the sensor is then implemented during a phase with no light emission.

FIG. 1 schematically shows an embodiment of an ambient light sensor 1.

The light sensor comprises pixels P1. Pixels P1 are, for example, organized in an array comprising rows and columns of pixels P1. In the example of FIG. 1, sensor 1 comprises 16 pixels P1 although, in other examples not illustrated, the number of pixels P1 can be different from 16, for example greater than 16, for example 512.

Figure 2:
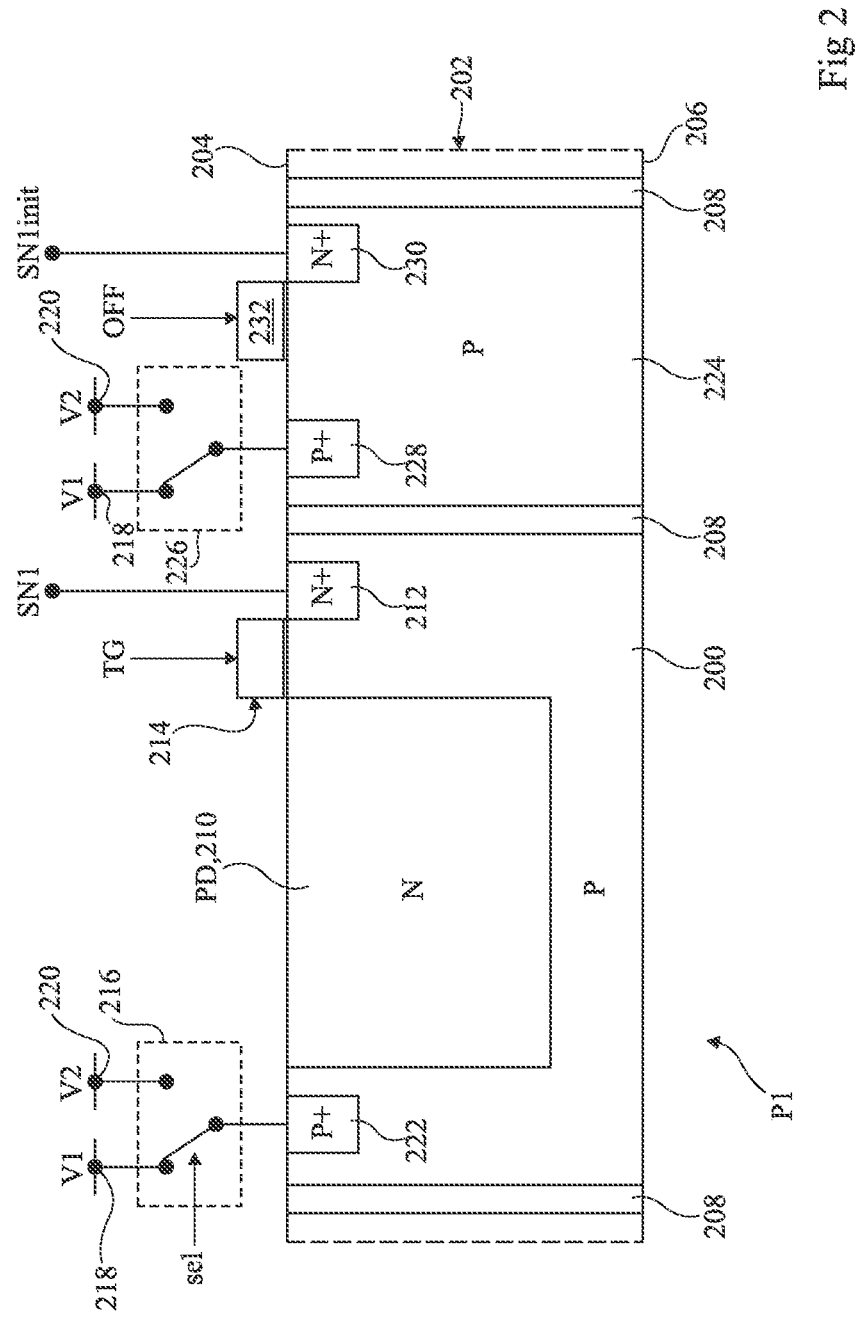
FIG. 2 illustrates, in a cross-section view, an embodiment of a pixel of the sensor of FIG. 1.

FIG. 2 illustrates, in a cross-section view, an embodiment of a pixel P1 of the sensor 1 of FIG. 1, it being understood that the other pixels P1 are implemented identically to the pixel P1 described in relation with FIG. 2.

Pixel P1 comprises an insulated well 200. Well 200 is doped with a first conductivity type, in this example type P. Well 200 is arranged, or extends, in a semiconductor layer 202, for example, made of silicon. In this example, well 200 extends across the entire thickness of layer 202, from a (top) surface 204 of layer 202 to a (bottom) surface 206 of layer 202.

Well 200 is referred to as being insulated in that it is electrically insulated from other regions and/or wells formed in layer 202 and outside of well 200.

In this example, well 200 is laterally insulated by trenches of deep trench insulation 208 (DTI), for example capacitive DTI trenches 208 (CDTI). In this example, trenches 208 cross layer 202 across its entire thickness.

In examples, not illustrated, well 200 extends across a portion only of the thickness of layer 202, from surface 204 of the layer (the upper surface in FIG. 2). In this case, a doped buried layer of a conductivity type opposite to that of the well or a non-doped buried semiconductor layer may be provided in layer 202 to delimit the bottom of well 200. In this case, if well 200 is laterally delimited and insulated by trenches of deep trench insulation 208, the latter penetrate into layer 202 all the way to the buried layer and may penetrate, or even cross, the buried layer.

In examples, not illustrated, trenches of deep trench insulation 208 are replaced with doped regions of the conductivity type opposite to that of well 200 or with non-doped semiconductor regions, these regions laterally bordering well 200 along its entire periphery.

In each example case as described immediately above, the well 200 is considered to be insulated.

Pixel P1 comprises a region PD of photoconversion of the light into electron-hole pairs, typically a photodiode. Photodiode PD, preferably a pinned photodiode, extends in well 200, from surface 204, and across a portion only of the thickness of well 200.

Photodiode PD comprises a doped well or region 210 of the N conductivity type opposite to the P type of well 200. This region 210 extends in well 200, from surface 204 and across only a portion of the thickness of well 200.

Pixel P1 further comprises a doped region 212 of the N conductivity type opposite to the P type of well 200. Preferably, region 212 is more heavily doped (N+) than region 210, that is, the doping level of region 212 is higher than the doping level of region 210. Region 212 is separated from region 210 or, in other words, is not in contact with region 210. Region 212 extends in well 200, from surface 204 and across a portion only of the thickness of well 200. For example, region 212 penetrates into well 200 down to a smaller depth than region 210. Region 212, for example, corresponds to a readout region of pixel P1.

As shown in FIG. 1, the regions 212 of all pixels P1 are connected together and to a same node SN1. In the illustrated example, sensor 1 only comprises pixels P1, and the regions 212 of all the pixels of sensor 1 are thus connected to node SN1.

A transfer gate 214 couples photodiode PD to region 212, that is, region 210 to region 212. More particularly, gate 214 is configured to electrically couple regions 210 and 212 to each other in the conductive state, and to electrically insulate regions 210 and 212 from each other in the non-conductive state. In particular, when gate 214 is conductive, the charges photogenerated and accumulated in photodiode PD are transferred into region 212, and the potential of region 212 after this transfer depends on the number of transferred charges. Region 212 forms the drain region of gate 214.

Gate 214 rests on surface 204 of layer 202, on a portion of well 200 separating regions 210 and 214 from each other.

Gate 214 is controlled by a signal TG. The signal TG of each pixel P1 is delivered by a control circuit CTRL of sensor 1, as illustrated in FIG. 1. In other words, circuit CTRL is configured to control the gates TG of pixels P1. As will be described in further detail hereafter, circuit CTRL may be configured to deliver the same signal TG to all pixels P1, that is, to control all pixels P1 identically, or may be configured to control part of pixels P1 and another part of pixels P1 differently.

Pixel P1 further comprises a circuit or switch 216 configured to selectively apply a potential V1 or a second potential V2 to well 200. In other words, circuit 216 has a first input terminal coupled, for example connected, to a node 218 configured to receive potential V1, a second input terminal coupled, for example connected, to a node 220 configured to receive potential V2, and an output terminal coupled, for example, connected, to well 200, and is configured to couple its output terminal selectively to its first input terminal or to its second input terminal.

As an example, well 200 comprises a contacting region 222 more heavily P-type doped (P+) than well 200, and circuit 216 is coupled to well 200 by region 222.

When well 200 is P-type doped as is the case in the described example, potential V2 is greater than potential V1. For example, potential V2 is positive and referenced to potential V1. For example, potential V1 is ground potential GND, and potential V2 is substantially equal to 100 mV, for example, equal to 100 mV.

The circuit 216 of pixel P1 is controlled by a selection signal sel. The signal sel of each pixel P1 is delivered by a circuit SAR of sensor 1 as illustrated in FIG. 1. In other words, circuit SAR is configured to control the circuits 216 of pixels P1. Circuit SAR implements a successive approximation register function. As will be described in further detail hereafter, pixels P1 are distributed into a plurality of groups of P1, and circuit SAR is configured to deliver the same signal sel to all the pixels P1 of a same group of pixels P1, where signal sel may be different between two groups of pixels P1.

According to an embodiment, for example, illustrated in FIG. 2, pixel 1 further comprises an insulated well 224 similar to well 200. In particular, well 224 extends in layer 202 and is doped with the same conductivity type as well

200, that is, type P in this example. Well 224 is insulated from the regions and/or wells arranged outside of well 224, in the same way as well 200 is insulated from the regions and/or wells arranged outside of well 200. More particularly, in the example of FIG. 2, well 224 extends from surface 204 to surface 206 and is laterally delimited by insulating trenches 208.

Well 224 is configured to receive potential V1. More particularly, well 222 is configured to be maintained at potential V1 all along the duration of each phase of capture of the ambient light by sensor 1.

According to an embodiment, pixel P1 comprises a circuit, or switch, 226 configured to selectively apply a potential V1 or a second potential V2 to well 224, circuit 226 being preferably identical to circuit 216. Circuit 226 is then configured to maintain potential V1 on well 224 all along the duration of each phase of capture of the ambient light by sensor 1. For example, circuit 226 is controlled by circuit SAR (FIG. 1). As an example, well 224 comprises a contacting region 228 more heavily P-type doped (P+) than well 224, and circuit 226 is coupled to well 224 by region 228.

As a variant, potential V1 is directly applied to well 224, without use of switch 226, by connecting node 218 to well 224, for example, to the region 228 of well 224.

Well 224 comprises a region 230 similar or identical to region 212, and a transfer gate 232 similar or identical to gate 214. In particular, gate 232 is coupled to region 230 in the same way as gate 214 is coupled to region 212. In other words, the arrangement of gate 232 and of region 230 with respect to each other is identical to the arrangement of gate 214 and of region 212 with respect to each other. Region 230 is N-type doped, for example, heavily N-type doped (N+). Preferably, the doping level of region 230 is the same as that of region 212, the doping level of well 224 being the same as that of well 200.

Gate 232 is configured to be maintained in the non-conductive state all along the duration of each phase of capture of the ambient light by sensor 1. As an example, gate 232 is maintained in the non-conductive state by a signal OFF applied to gate 232. As an example, signal OFF is delivered to each gate 232 by circuit CTRL (FIG. 1).

Unlike well 200, no photodiode PD is formed in well 224, which may thus be smaller than well 200. Preferably, well 224 has lateral dimensions, that is, dimensions taken in a plane parallel to surface 204, which are smaller than those of well 200.

As shown in FIG. 1, the regions 230 of all pixels P1 are connected together and to a same node SN1init. Thus, in this example where sensor 1 only comprises pixels P1, the regions 230 of all the pixels of sensor 1 are connected to node SN1init.

Referring again to FIG. 1, sensor 1 further comprises an analog-to-digital converter 100. Converter 100 comprises a connection to node SN1.

More particularly, node SN1 corresponds to an input of converter 100 on which is present a potential that converter 100 is configured to convert into a binary word representative of the value of this potential.

Converter 100 also comprises a switch IT1, for example, a MOS transistor, configured to selectively apply a potential V3 to node SN1. More particularly, switch IT1 is configured to apply potential V3 to node SN1 only when switch IT1 is on. In other words, switch IT1 has a conduction terminal coupled, for example, connected, to a node 102 configured to receive potential V3, and a conduction terminal coupled, for example connected, to node SN1. The circuit CTRL of converter 1 is configured to control switch IT1, for example, via a signal IT1ctrl.

When well 200 is P-type doped as is the case in the described example, potential V3 is greater than potential V1. For example, potential V3 is positive and referenced to potential V1. For example, potential V3 is greater than potential V2. As an example, potential V3 is determined so that a control potential, for example, a high potential of power supply of the sensor, applied to a gate 214 having its region 212 at potential V3 makes gate 214 conductive, while maximizing the conversion dynamics of converter 100. The determination of potential V3 is within the abilities of those skilled in the art based on the functional indications given in the present disclosure. As an example, potential V3 is substantially equal to 1.5 V, for example, equal to 1.5 V.

Converter 100 further comprises a comparator 104, for example, an operational amplifier assembled as a comparator. Comparator 104 has an input 106 coupled to node SN1.

According to an embodiment, node SN1 is coupled to input 106 by an analog buffer circuit 107. Circuit 107 is configured to receive the potential of node SN1 and to deliver this potential or a potential corresponding to the input 108 of comparator 104. For example, circuit 107 comprises an input coupled, preferably connected, to node SN1 and an output coupled, preferably connected, to input 106.

As an example of implementation, circuit 107 comprises a MOS transistor T1 and a current source S1 connected in series. Transistor T1 is configured as a source-follower and has its gate corresponding to the input of circuit 107 and its source corresponding to the output of circuit 107.

Comparator 100 is configured to compare the potential of node SN1 with a comparison potential, and to supply a binary signal COMP having its binary state indicating whether the potential of node SN1 is greater or smaller than this reference potential.

According to an embodiment, the comparison potential is determined by potential V3. For example, the comparison potential is configured to be equal to the potential of node SN1 after switch IT1 has been switched to the on state and then to the off state, that is, after an initialization of node SN1 at potential V3 by switch IT1 and before one or a plurality of transfer gates 214 have been switched to the conductive state.

According to an embodiment where each pixel P1 comprises a well 224, a region 230, and a gate 232 as described in relation with FIG. 2, converter 100 further comprises node SN1init and a switch IT2. Switch IT2, for example, a MOS transistor, is configured to selectively apply potential V3 to node SN1init. Preferably, the implementation of switch IT2 is identical to that of switch IT1. The circuit CTRL of converter 1 is configured to control switch IT2 identically to switch IT1, for example, via the same signal IT1ctrl. In this case, the comparison potential with which the potential of node SN1 is compared during an analog-to-digital conversion is available on node SN1init. An input 108 of the comparator is then coupled to node SN1init.

According to an embodiment where node SN1 is coupled to input 106 of the comparator by circuit 107, node SN1init is coupled to input 108 of the comparator by an analog buffer circuit 110. For example, circuit 110 comprises an input coupled, preferably connected, to node SN1init and an output coupled, preferably connected, to input 108.

Preferably, the implementation of circuit 110 is identical to that of circuit 107. For example, circuit 110 comprises a MOS transistor T2 and a current source S2 connected in series. MOS transistor T2 is configured as a follower source and has its gate corresponding to the input of circuit 110 and its source corresponding to the output of circuit 110.

Converter 100 further comprises circuit SAR. Circuit SAR is configured to receive the output signal COMP of comparator 104. During a phase of analog-to-digital conversion of the potential of node SN1, circuit SAR is configured to control the circuits 216 of pixels P1 based on signal COMP.

Circuit SAR is further configured to determine a binary word corresponding to the result of the analog-to-digital conversion of the potential of node SN1, based on the signal COMP obtained at each of the successive approximations implemented by converter 100.

In practice, as seen from the converter 100 of sensor 1, each pixel P1 corresponds to a first capacitive element C0 having a terminal connected to node SN1 and a terminal selectively coupled to node 218 or 220 by the circuit 216 of this pixel P1. More particularly, in each pixel P1, this first capacitive element C0 corresponds to the capacitance on the drain of gate 214, that is, to the drain capacitance of gate 214. The first capacitive elements C0 and the circuits 216 of the pixels implement a bank of capacitive elements used during phases of successive approximations of an analog-to-digital conversion by converter 1. In other words, the capacitive elements C0 and the circuits 216 of pixels P1 implement a digital-to-analog converter controlled by the signals sel of circuit SAR.

Further, according to an embodiment where each pixel P1 comprises a well 224, a region 230, and a gate 232 as described in relation with FIG. 2, seen from the converter 100 of sensor 1, each pixel P1 then also corresponds to a second capacitive element C1 having a terminal connected to node SN1init and a terminal coupled to node 220, for example, by the circuit 226 of this pixel P1. More particularly, in each pixel P1, this second capacitive element C1 corresponds to the capacitance on the drain of gate 232, it being understood that this gate 232 has no source.

Figure 3:
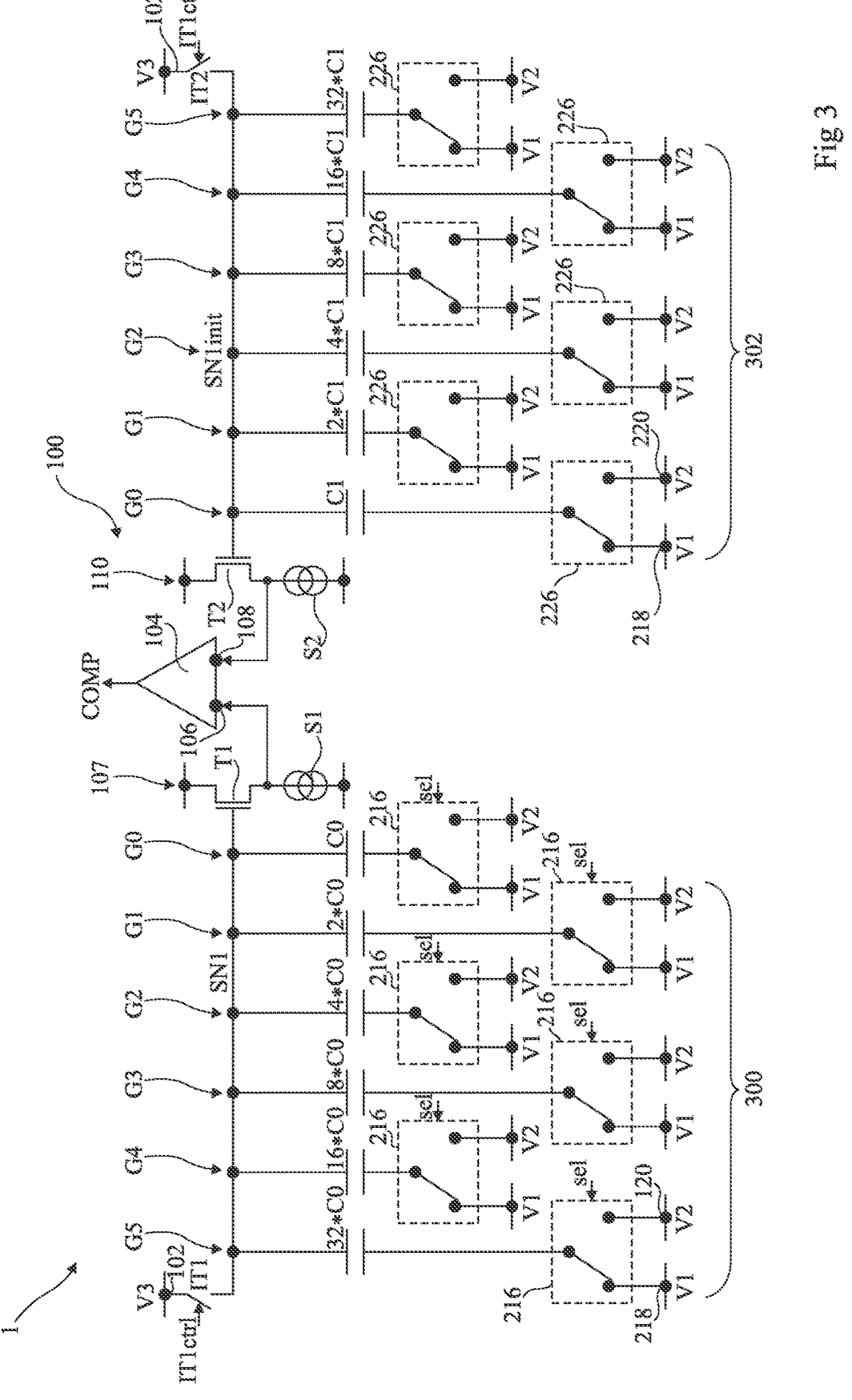
FIG. 3 schematically shows a circuit equivalent to the sensor of FIG. 1.

FIG. 3 shows a circuit equivalent to the sensor 1 of FIG. 1. In FIG. 3, circuits SAR and CTRL are not shown.

As previously indicated, each pixel P1 corresponds to a first capacitive element C0 connected between node SN1 and circuit 216 of the pixel.

Further, in the example of FIG. 3, an embodiment where each pixel P1 comprises a well 222, a gate 232, and a region 230 (see FIG. 2) and where the regions 230 of all pixels P1 are connected to node SN1init, is considered. Converter 100 then comprises node SN1init and switch IT2. Further, each pixel P1 also corresponds to a second capacitive element C1 coupling node SN1init to potential V1, for example, via circuit 226 of the pixel.

According to an embodiment, as illustrated in FIG. 3, pixels P1 are distributed into a plurality of groups. Each pixel P1 belongs to a single one of the groups.

In each group of pixels P1, the capacitive elements C1 of the pixels P1 in the group then correspond to a capacitive element of a digital-to-analog converter 300 of converter 1. The value of each capacitive element of converter 1 is then a multiple of the capacitive value of a capacitive element C0.

Further, in each group of pixels P1, the circuits 216 of all the pixels P1 in the group are controlled in the same way by circuit SAR. In other words, all the pixels P1 of a given group Gi receive the same signal sel, which signal sel may be different from that received by all the pixels P1 of another group Gi of pixels P1.

In this example where each pixel P1 further corresponds to a second capacitive element C1, in each group of pixels P1, the capacitive elements Cl of the pixels P1 in the group then correspond to a capacitive element of a circuit 302 delivering the comparison potential to the input 108 of comparator 104. The value of each capacitive element of converter 1 then is a multiple of the capacitive value of a capacitive element C1.

The distribution of pixels P1 into a plurality of groups is configured to implement the digital-to-analog converter 300 of the successive approximation analog-to-digital converter 100. Converter 300 is controlled by all the signals sel delivered to pixels P1 by the circuit SAR of converter 100 and, more exactly, by all the signals sel delivered to the groups Gi of pixels P1.

According to an embodiment, converter 100 comprises K groups Gi of pixels P1, with i an integer index ranging from 0 to K−1, and each group Gi comprises 2 exponent i pixels P1.

Thus, each group Gi of pixels P1 is equivalent to a capacitive element of converter 300 of value $2^{i}*C0$. In the example of FIG. 3, sensor 1 comprises K equal 6 corresponding groups G0, G1, G2, G3, G4, and G5 of the capacitive elements of converter 300 of respective values C0, 2*C0, 4*C0, 8*C0, 16*C0, and 32*C0. In this example, each group Gi of pixels P1 is also equivalent to a capacitive element of circuit 302 of value $2^{i}*C1$. More particularly, groups G0, G1, G2, G3, G4, and G5 correspond to capacitive elements of circuit 302 of respective values Cl, 2*C1, 4*C1, 8*C1, 16*C1, and 32*C1.

In other examples, not illustrated, the number K of groups of pixels P1 is different, for example, smaller or greater than 6, for example, equal to 8 when the sensor comprises 512 pixels P1.

In the case where the number of pixels P1 of sensor 1 is such that the pixels P1 of sensor 1 cannot all be distributed into groups Gi such as defined hereabove, the pixels P1 which do not form part of one of the groups Gi are distributed into an additional group of pixels P1 which will not be used to implement a capacitive element of the digital-to-analog converter 300 of converter 100, nor a capacitive element of circuit 302. In other words, the circuits 216 of the pixels P1 of this additional group are controlled so that the same potential V1 or V2, preferably potential V1, remains applied to the wells 200 of these pixels all along the duration of operation of sensor 1. These pixels P1 then correspond to an intrinsic capacitance of node SN1. The pixels P1 of the additional group are thus not used to implement a capacitive element of converter 300 but the charges which are photogenerated in the photodiodes of these pixels P1 of the additional group may, for example, be transferred to node SN1 to take part in the gain of sensor 1.

In the sensor 1 described in relation with FIGS. 1 to 3, after nodes SN1 and SN1init have been initialized at potential V3 by switches IT1 and IT2 in the on state, the latter are switched to the off state. In this context, the potential of node SN1 after this switching to the off state of switch IT1 is referred to as the "initialization potential of node SN1." The initialization of the potential of nodes SN1 and SN1init is followed by the setting to the conductive state of the transfer gates 214 of at least certain pixels P1, which causes a modification of the potential of node SN1 with respect to its initialization potential, for example, a decrease in the potential of node SN1 with respect to its initialization potential in this example where wells 200 are P-type doped.

The analog-to-digital conversion of the potential of node SN1 at the end of a charge transfer to node SN1 comprises controlling the circuits 216 of groups Gi to determine, by dichotomy or successive approximations, the combination of the control signals sel of the groups Gi for which the potential of node SN1 is taken at closest to the initialization potential of node SN1, that is, at closest to the potential of node SN1init in this example where converter 100 comprises circuit 302.

In other words, the analog-to-digital conversion of the potential of node SN1 after a charge transfer to node SN1 comprises determining for each group Gi of pixels P1, by successive approximations, whether the wells 200 of the pixels P1 in group Gi should all receive potential V1 or all receive potential V2 so that the potential of node SN1 is taken as close as possible to the initialization potential of node SN1.

Based on the combination of signals sel thus determined, the binary word corresponding to the value of the potential of node SN1 after the charge transfer can be deduced. This binary word then indicates the quantity of transferred charges, and thus the quantity of light received by sensor 1.

Figure 4:
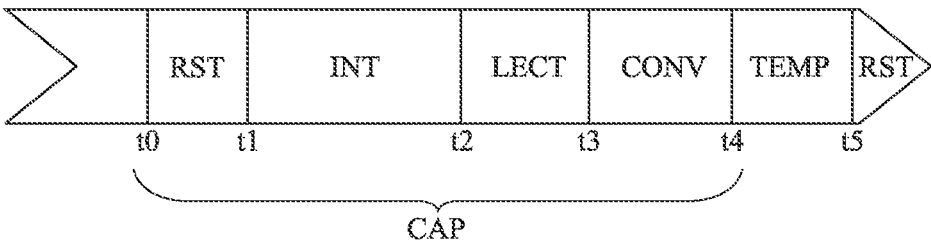
FIG. 4 shows a timing diagram illustrating an implementation mode of the operation of the sensor of FIG. 1.

FIG. 4 illustrates in a timing diagram an embodiment of the previously-described sensor 1. In the example of FIG. 4, a single phase CAP of capture of the ambient light by sensor 1 is illustrated, it being understood that a plurality of phases CAP may be implemented, repetitively, one after the other.

At a time t0, capture phase CAP starts. Time t0, for example, corresponds to the end of a previous capture phase CAP or to the end of a delay period separating two successive capture phases CAP.

Time t0 corresponds to the beginning of a phase RST of initialization of the photodiodes PD of pixels P1. For this purpose, the transfer gates 214 of pixels P1 and switch IT1 are switched to the on state by circuit CTRL. As a result, photodiodes PD are initialized at potential V3.

All along the duration of phase RST, potential V1 is applied to the wells 200 of pixels P1.

Phase RST ends at a time t1 subsequent to time t0. At time t1, the transfer gates 214 are switched to the non-conductive state by circuit CTRL.

Time t1 thus marks the beginning of an integration phase INT, during which the light received by each photodiode PD is converted into charges which accumulate in the photodiode.

All along the duration of phase INT, potential V1 is applied to the wells 200 of pixels P1.

Preferably, all along the duration of phase INT, switch IT1 is maintained in the on state.

Integration phase INT ends at a time t2 subsequent to time t1. Time t2 corresponds to the beginning of a phase LECT of reading of at least part of pixels P1.

At time t2, switch IT1 is switched to the off state. After the switching to the off state of switch IT1, node SN1 is at its initialization potential. Switch IT1 is then maintained in the off state all along the duration of readout phase LECT. In this example, it is further considered that converter 100 comprises circuit 302. Thus, at time t2, switch IT2 is also switched to the on state and node SN1init is then at a potential equal to the initialization potential of node SN1.

After the switching to the off state of switch IT1, and thus of switch IT2 in this example, the transfer gates 214 of at least some of pixels P1 are switched to the conductive state by circuit CTRL.

According to an embodiment, the transfer gates 214 of all pixels P1 are switched to the conductive state by circuit CTRL. In such an embodiment, the gain of sensor 1 will be maximum.

According to an alternative embodiment, the transfer gates 214 of a portion only of pixels P1 are switched to the conductive state by circuit CTRL, the transfer gates 214 of the other pixels P1 being maintained in the non-conductive state by circuit CTRL. As a result, a portion only of the charges photogenerated in all the photodiodes PD of the pixels P1 of sensor 1 are transferred to node SN1, which amounts to decreasing the gain of sensor 1 with respect to its maximum gain. For example, by switching to the conductive state the transfer gates 214 of half only of pixels P1, the gain of sensor 1 is decreased by half with respect to its maximum gain.

The setting to the conductive state of the gates 214 of at last certain pixels P1 causes a transfer of the charges photogenerated in the photodiodes of these pixels P1 to node SN1, which results in a modification of the potential of node SN1 representative of the number of transferred charges. For example, when the wells 200 of pixels P1 are P-type doped, the potential of node SN1 decreases. However, the potential of node SN1init remains unchanged.

All along the duration of phase LECT, potential V1 is applied to the wells 200 of pixels P1.

At a time t3 corresponding to the end of phase LECT, the gates 214 of all pixels P1 are switched to the non-conductive state by circuit CTRL.

After time t3 or, as is the case in FIG. 4, at time t3, a phase CONV of analog-to-digital conversion of the potential of node SN1 by converter 100 starts.

Phase CONV comprises a plurality of successive steps corresponding to successive approximations of the potential of node SN1 at the end of the charge transfer, that is, at the end of the readout phase.

At each of these successive steps or approximations, circuit SAR switches, for at least one of the groups Gi of pixels P1, the potential which is applied to the wells 200 of these pixels P1 by their circuits 216. In other words, at each approximation, circuit SAR switches, for at least one group Gi of pixels P1, the state of the signal sel delivered to the pixels P1 in this group. Circuit SAR then observes the state of output COMP to determine the control signals sel of the next successive approximation.

The phase of conversion by successive approximations is within the abilities of those skilled in the art based on the functional indications described hereabove and on this general knowledge in the field of successive approximation analog-to-digital converters.

For example, at the beginning of phase CONV, during the first approximation, circuit SAR controls the circuits 216 of the pixels P1 of group GK-1 (G5 in the example of FIG. 3) so that potential V2 is applied to their wells 200, by maintaining potential V1 on the wells 200 of the other pixels P1. If the potential of node SN1 becomes greater than the comparison potential received by the input 108 of comparator 104, circuit SAR sets its most significant bit to a first value, and, at the next approximation, circuit SAR will apply potential V2 to the wells of the pixels P1 of groups GK-2 (G4 in the example of FIG. 3), and potential V1 to the wells of the pixels P1 of all the other groups Gi. Conversely, if the potential of node SN1 remains smaller than the comparison potential, circuit SAR sets its most significant bit to a second value, and, at the next approximation, circuit SAR will apply potential V2 to the wells of the pixels P1 of groups GK-1 and GK-2, and potential V1 to the wells of the pixels P1 of all the other groups. This next approximation enables to determine what is the value of the bit of weight immediately smaller than the most significant bit. The approximations follow one another to determine, for each bit of circuit SAR, that is, for each bit of the binary output word of converter 100, whether the bit is at the first value or at the second value.

At a time t4 corresponding to the end of phase CONV and of phase CAP, circuit SAR delivers the binary word corresponding to the result of the analog-to-digital conversion of the potential of node SN1 at time t3.

Capture phase CAP may be immediately followed by the beginning of a next capture phase CAP or, as illustrated in FIG. 4, a delay period TEMP may be provided between two successive phases CAP. As an example, a delay period TEMP is provided between every two successive phases CAP when sensor 1 is arranged under a screen alternating phases of light emission and phases with no light emission and where each integration phase INT is implemented during a corresponding phase where the screen emits no light.

As an example, in a sensor 1 such as previously described in relation with FIGS. 1 to 4, each capacitive element C0 has a value substantially equal to 0.5 fF.

As an example, each capacitive element C0 corresponds to the sum of the capacitance between region 212 and the well 200 of the corresponding pixel P1 and of the capacitance of the electric connection tracks coupling region 212 of pixel P1 to node SN1. Due to the fact that these connection tracks are different from one pixel P1 to another, value C0 may exhibit dispersions from one pixel P1 to the other.

The provision of circuit 302 enables a conversion error or offset resulting from the voltage drop across switch IT1 to be compensated by the voltage drop across the switch.

Further, the fact for the node SN1init of circuit 302 to be coupled to the input 108 of comparator 104 by a buffer circuit 110 identical to the buffer circuit 107 coupling the node SN1 of circuit 300 to the input 106 of comparator 104 enables to compensate for a conversion error or offset resulting from circuit 107.

One has described hereabove in relation with FIGS. 1 to 4 examples of embodiments where converter 100 comprises circuit 302 and each pixel P1 comprises a well 224, a region 230, and a gate 232. In alternative embodiments, circuit 302 is replaced with another circuit configured to deliver the comparison potential to comparator 104 and, in each pixel P1, well 224, region 230, and gate 232 are suppressed. For example, circuit 302 may be replaced with a voltage source configured to deliver the comparison potential, this voltage source being, for example, coupled to the input 108 of comparator 104 by circuit 110, or even directly connected to input 108. As an example, the comparison potential delivered by the voltage source is then equal to V3 minus the voltage drop across switch IT1 when the voltage source is coupled to comparator 104 by circuit 110 and circuit 300 is coupled to comparator 104 by circuit 107. As an alternative example, the comparison potential delivered by the voltage source is then equal to V3 minus the voltage drop across switch IT1 minus the voltage drop in circuit 107 when the voltage source is directly connected to comparator 104 and circuit 300 is coupled to comparator 104 by circuit 107.

Described hereabove in relation with FIGS. 1 and 3 is an example of implementation of analog buffer circuits 107 and 110. Those skilled in the art are capable of providing other implementations for these circuits.

Described hereabove in relation with FIGS. 1 to 4 are examples of embodiments where sensor 1 only comprises pixels P1.

In alternative embodiments, sensor 1 may further comprise a plurality of pixels P2 implemented identically to pixels P1, with the difference that the regions 212 of pixels P2 are all connected to a node SN2 and, in the case where pixels P2 each comprise a well 224, a region 230, and a gate 232, the regions 230 of pixels P2 are all connected to a node SN2init. An additional analog-to-digital converter similar to converter 100 is then provided, with the difference that, in this additional converter, nodes SN1 and SN1init are replaced with respective nodes SN2 and SN2init and the circuits 216 controlled by this additional analog-to-digital converter are those of pixels P2.

Such an alternative embodiment enables pixels P1 to be configured to receive light in a wavelength range different from that of the light received by pixels P2, so that the ambient light level in each of these two ranges may be determined by sensor 1.

More generally, a sensor 1 comprising any non-zero number of assemblies, each comprising a plurality of pixels such as previously described, may be provided, where each analog-to-digital converter is of the previously-described type and uses the drain capacitances of the transfer gates of the pixels to which it is coupled to implement its analog-to-digital converter, that is, to implement its successive approximations. In this case, comparator 104 and/or circuit SAR may be common to all these analog-to-digital converters and shared by all these converters. For example, in the case where the comparator is common to all these analog-to-digital converters and is shared by all these analog-to-digital converters, a multiplexing circuit may be provided between each digital-to-analog converter and comparator 104, which multiplexing circuit may even be internal to comparator 104.

Various embodiments and variants have been described. Those skilled in the art will understand that certain features of these various embodiments and variants may be combined, and other variants will occur to those skilled in the art. In particular, those skilled in the art are capable of adapting the previously-described embodiments and variants to the case where the P, respectively N, conductivity type is replaced with the N, respectively P conductivity type, for example by adapting the values of potentials V1, V2, and V3, for example, by inverting the sign of potentials V1, V2, and V3.

Finally, the practical implementation of the described embodiments and variations is within the abilities of those skilled in the art based on the functional indications given hereabove.

The invention claimed is:

1. An ambient light sensor, comprising:
   a plurality of pixels, wherein each pixel comprises:
      a first doped insulated well of a first conductivity type;
      a pinned photodiode arranged in the first doped insulated well;
      a first doped region of a second conductivity type arranged in the first doped insulated well;
      a first transfer gate coupling the pinned photodiode to the first doped region; and
      a first circuit configured to selectively apply a first potential and a second potential to the first doped insulated well;
   a successive approximation analog-to-digital converter comprising:
      a first node connected to the first doped regions of all the pixels of the plurality of pixels;
      a first switch configured to selectively apply a third potential to the first node;
      a comparator having a first input coupled to the first node; and
      a second circuit configured to receive an output of the comparator and to control selective application of the first and second potentials to the first doped insulated well by the first circuits; and a control circuit configured to control actuation of the first transfer gates and control selective application of the third potential to the first node by the first switch.

2. The sensor according to claim 1, wherein a second input of the comparator is coupled to a comparison potential.

3. The sensor according to claim 2, wherein the comparison potential is determined at least in part by the third potential.

4. The sensor according to claim 2:
   wherein each pixel of the plurality of pixels further comprises:
      a second doped insulated well of the first conductivity type and configured to receive the first potential;
      a second doped region of the second conductivity type arranged in the second doped insulated well; and
      a second transfer gate coupled to the second doped region;
   wherein the successive approximation analog-to-digital converter further comprises:
      a second node connected to the second doped regions of all the pixels of the plurality of pixels, wherein the second node is coupled to the second input of the comparator; and
      a second switch configured to selectively apply the third potential to the second node.

5. The sensor according to claim 4, wherein the successive approximation analog-to-digital converter further comprises:
   a first analog buffer having an input connected to the first node and an output coupled to the first input of the comparator; and
   a second analog buffer having an input connected to the second node and an output coupled to the second input of the comparator;
   wherein the first and second analog buffers are identical circuits.

6. The sensor according to claim 4, wherein the control circuit is further configured to identically control switching of the first and second switches.

7. The sensor according to claim 4, wherein the control circuit is further configured to:
   control actuation of the second transfer gates; and
   maintain the second transfer gates in the non-conductive state all along the duration of each phase of capture of ambient light by the sensor.

8. The sensor according to claim 1, wherein, during each phase of analog-to-digital conversion of a potential of the first node, the second circuit is configured to control selective application of the first and second potentials to the first doped insulated well by the first circuits based on the output of the comparator.

9. The sensor according to claim 1, wherein, during each phase of analog-to-digital conversion of a potential of the first node, the control circuit is configured to maintain the first switch off.

10. The sensor according to claim 1, wherein:
   the pixels of the plurality of pixels are distributed into a plurality of groups of pixels;
   each pixel of the plurality of pixels belongs to a single group among said plurality of groups of pixels; and
   the second circuit is configured, during each phase of analog-to-digital conversion of a potential of the first node and for each group of pixels, to identically control the first circuits of the pixels of said group.

11. The sensor according to claim 10, wherein the second circuit is configured, at each of the successive approximations of the successive approximation analog-to-digital converter, to switch the potential applied to the first doped insulated wells of the pixels of at least one group by the corresponding first circuits.

12. The sensor according to claim 1, wherein, during each phase of initialization of the photodiodes, the control circuit is configured to switch to the conductive state the first transfer gates of all the pixels of the plurality of pixels and to control a turning on of the first switch.

13. The sensor according to claim 1, wherein, during each integration phase, the control circuit is configured to maintain in the non-conductive state the first transfer gates of all the pixels of the plurality of pixels all along the duration of the integration phase and, preferably, to maintain the first switch in the on state.

14. The sensor according to claim 1, wherein, during each readout phase:

the control circuit is configured to switch to the conductive state the first transfer gates of at least certain pixels of the plurality of pixels, a number of said at least certain pixels determining, for example, a gain of the sensor; and the control circuit is configured to maintain the first switch off all along the duration of the readout phase.

15. The sensor according to claim 1, wherein, all along the duration of each phase of initialization of the photodiodes, each integration phase, and each readout phase, the second circuit is configured so that the first circuits apply the first potential to the first doped insulated wells of all the pixels of the plurality of pixels.

16. An ambient light sensor, comprising:

a plurality of pixels, wherein each pixel comprises:

a first doped insulated well of a first conductivity type;

a pinned photodiode arranged in the first doped insulated well;

a first doped region of a second conductivity type arranged in the first doped insulated well;

a first transfer gate coupling the pinned photodiode to the first doped region; and a first circuit configured to selectively apply a first potential and a second potential to the first doped insulated well;

wherein the first doped regions of all the pixels of the plurality of pixels are connected to a first node;

a control circuit configured to control actuation of the first transfer gates and control selective application of a third potential to the first node;

a comparator having a first input coupled to the first node; and a processing circuit configured to receive an output of the comparator and to control selective application of the first and second potentials to the first doped insulated well by the first circuits based on the output of the comparator.

17. The sensor according to claim 16, wherein a second input of the comparator is coupled to a comparison potential.

18. The sensor according to claim 16, wherein the processing circuit implements a successive approximation register (SAR) function.

* * * * *